United States Patent

[11] 3,573,574

[72] Inventor Roland O. Davis
Mount Clemens, Mich.
[21] Appl. No. 849,367
[22] Filed Aug. 12, 1969
[45] Patented Apr. 6, 1971
[73] Assignee General Motors Corporation
Detroit, Mich.

[54] CONTROLLED RECTIFIER MOUNTING ASSEMBLY
6 Claims, 11 Drawing Figs.

[52] U.S. Cl. .......... 317/234, 317/235, 321/8
[51] Int. Cl. .......... H01l 1/12, H01l 1/14
[50] Field of Search .......... 317/234, 235, 235.1, 235.4, 235.4.1, 235.5, 235.5.4, 235.6, 235.11; 321/8

[56] References Cited
UNITED STATES PATENTS
3,280,389 10/1966 Martin .......... 317/234
3,506,889 4/1970 Vogt .......... 317/234
3,512,053 5/1970 Andersson et al. .......... 317/234

*Primary Examiner*—James D. Kallam
*Assistant Examiner*—R. F. Polissack
*Attorneys*—E. W. Christen, Creighton R. Meland and Robert W. Smith

ABSTRACT: A mounting assembly for a semiconductor power supply circuit includes a first series and a second series of mounting supports having heat sink members for attaching opposite ends of pressure contact type semiconductors to the mounting supports. The heat sinks provide cooling of the semiconductors and also include spherical joints for distributing compressive pressures evenly across the ends of each semiconductor. The semiconductors and mounting supports are assembled in a stacked arrangement which forms integral power supply circuit connections. A cooling system is provided for circulating and cooling a liquid coolant which flows through the heat sinks.

Patented April 6, 1971 3,573,574

4 Sheets-Sheet 1

INVENTOR.
Roland O. Davis
BY
Robert W. Smith
ATTORNEY

INVENTOR.
Roland O. Davis
BY
Robert W. Smith
ATTORNEY

INVENTOR.
Roland O. Davis
BY
Robert W. Smith
ATTORNEY

INVENTOR.
Roland O. Davis
BY
Robert W. Smith
ATTORNEY

CONTROLLED RECTIFIER MOUNTING ASSEMBLY

This invention relates to mounting assemblies for semiconductor devices and more particularly to a mounting assembly for a power supply circuit including pressure contact type semiconductor devices.

Improvements in the power handling capacity of semiconductor devices have been advantageous in developing the use of semiconductors in power supply circuits intended for heavy-duty applications which heretofore were impractical or impossible. The mounting and packaging of such semiconductor circuits are closely associated with the development of higher power handling capacity of semiconductors and the cost and rating of the particular semiconductors which are used. Also, the size, cooling capabilities, and ruggedness of the circuit mounting assembly are all factors which must be considered in improving the practical application of semiconductor circuits. Improved power supply systems typically include semiconductor inverter and converter circuits utilized in supplying heavy-duty electrical loads such as electric motor drives for fans, pumps, machine tools and electric vehicles.

Semiconductor circuits designed for heavy-duty electrical applications generally include silicon power semiconductor devices having large area wafers of silicon semiconductor material. These power semiconductor devices employ large area heat sink electrodes, usually formed of copper, in contact with both sides of the semiconductor wafer. Because of stresses developed on the wafer by variation of temperatures, the electrical and thermal contact between the power electrodes and the wafer is provided by applying external pressure on the electrodes rather than by soldering or welding the electrodes directly to the wafer. This permits a sliding action to relieve the shear stresses which develop in the semiconductor wafer. These devices are generally formed with a disc-shaped casing having flat electrodes on either side and thereby enable both sides to be cooled.

Accordingly, a packaging and mounting assembly which supports pressure contact semiconductor devices must provide interconnection of the flat electrodes in a particular circuit arrangement and also provide cooling at the electrode surfaces to obtain the maximum power handling capacity, reliability and use of lower cost semiconductors. Without proper cooling, the semiconductor devices must be operated at lower than rated current carrying capacity so that stresses are not developed which will cause damage to the semiconductor wafer assembly.

In order to provide a semiconductor circuit mounting assembly which is compact, has minimum weight and which provides the proper mounting of the semiconductor devices, each of the mounting and supporting members of the assembly must provide multiple functions. The mounting supports of the assembly must provide proper pressure on both sides of each semiconductor, the proper electrical contact, cooling, and permit simple electrical connections between the semiconductor devices and external circuits.

In the present invention, a mounting assembly for a semiconductor power supply circuit includes a single compact arrangement for disc-shaped semiconductor controlled rectifiers having pressure contact electrodes. The controlled rectifiers are arranged in axially aligned stacks which include groups of controlled rectifiers which are aligned in side-by-side relationship. Each end of a controlled rectifier is carried by a heat sink member and the groups of controlled rectifiers are clamped between the heat sink members of two adjacent mounting supports. The heat sink members include a plurality of fins and a spherical joint for providing adjustable thermal and electrical contacts between the controlled rectifier electrodes and the mounting supports when pressure is applied across the supports. In one series of mounting supports a common electrical junction is provided for connecting together the adjacent electrodes of two adjacent groups of controlled rectifiers. In a second series of mounting supports, three common junctions are formed between three pairs of adjacent controlled rectifiers which are included in adjacent groups. Each of the first series of mounting supports is alternately arranged with each of the second series of mounting supports. The connections formed by the mounting supports interconnect the controlled rectifiers in the desired power supply circuit configuration. Mounting supports at the end of the stacks of controlled rectifiers are provided with a clamping arrangement including a pair of end plates and a tie rod extending through the stacked assembly to apply pressure across the ends of the stacks. The spherical joint provided in the heat sinks permits alignment of the controlled rectifiers within the stacks so that the clamping pressure is applied evenly across the ends of each semiconductor device. A coolant is provided for cooling finned portions of the heat sinks. Electrical, as well as, thermal heat sink and self-adjusting pressure connections are provided between the mounting supports to provide an efficient mounting assembly for a semiconductor power supply circuits intended use in supplying large electrical loads.

Accordingly, it is an object of this invention to provide an improved mounting assembly for pressure contact semiconductor devices which is compact and provides evenly distributed electrode pressure, efficient cooling and simple electrical interconnections.

A further object of this invention is to provide an improved semiconductor mounting assembly which is easily assembled and manufactured by use of a minimum of different parts and provides a rugged assembly including a liquid cooling system for cooling semiconductor devices supplying heavy duty electrical loads.

A further object of this invention is to provide a semiconductor mounting assembly having a single tie rod and including stacks of power semiconductors having pressure contacts that are supported between mounting supports by aluminum heat sink members which conduct heat from both ends of each semiconductor and include spherical joints which are self-adjusting so that pressure is evenly applied across the ends of each semiconductor.

A still further object of this invention is to provide a mounting and packaging assembly for a polyphase power supply frequency converter circuit formed by stacks of semiconductor controlled rectifiers connected between two series of alternately arranged first and second mounting supports in which alternate adjacent groups of laterally arranged controlled rectifiers are connected to a common electrical junction and adjacent pairs of controlled rectifiers within two adjacent groups are connected together and are cooled by a liquid coolant passing through heat sinks mounted adjacent the ends of each semiconductor.

These and other objects of this invention will become apparent from the following description taken in connection with the drawings in which.

Figure 1:
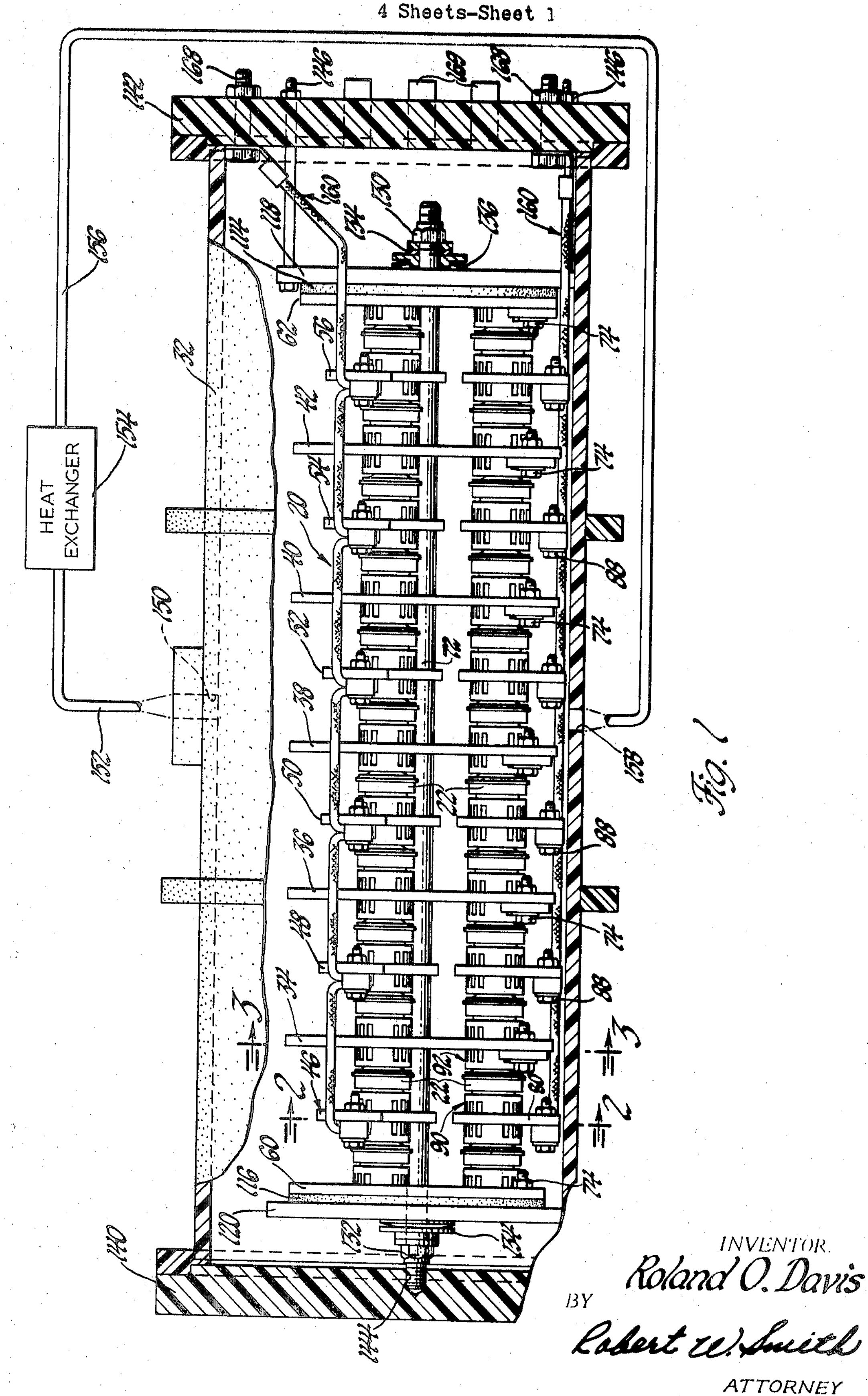
FIG. 1 is a side elevational view, partially in section, of one preferred embodiment of a mounting assembly of this invention.

Referring now to the drawings, there is shown in FIG. 1 a preferred embodiment of the semiconductor mounting assembly of this invention which is generally designated by the numeral 20. The mounting assembly 20 supports 36 power semiconductor devices 22 forming a power supply circuit, which in a preferred embodiment includes a frequency converter of the type known as a polyphase cycloconverter circuit. The semiconductor devices 22 are pressure contact thyristors of the silicon-controlled rectifier (SCR) type. These controlled rectifiers are power semiconductors capable of conducting load currents in the order of 300 to 400 amperes.

Figures 2, 3, 4:
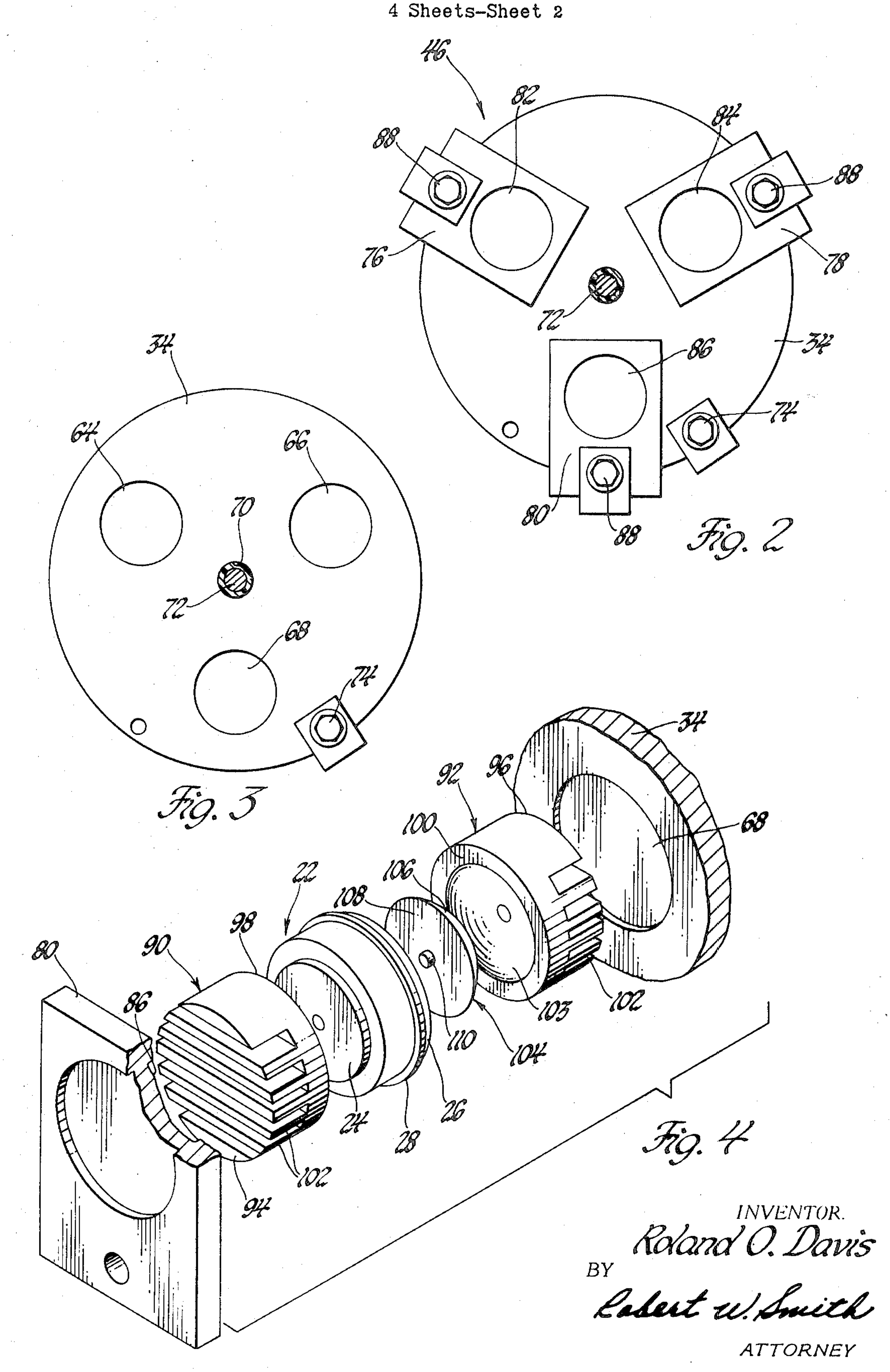
FIG. 2 is a sectional view taken along line 2–2 of FIG. 1, looking in the direction of the arrows.
FIG. 3 is a sectional view taken along line 3–3 of FIG. 1 looking in the direction of the arrows.
FIG. 4 is an exploded perspective view of the mounting of a semiconductor device carried by heat sink members in the mounting assembly of this invention illustrated in FIG. 1.
Figure 5:
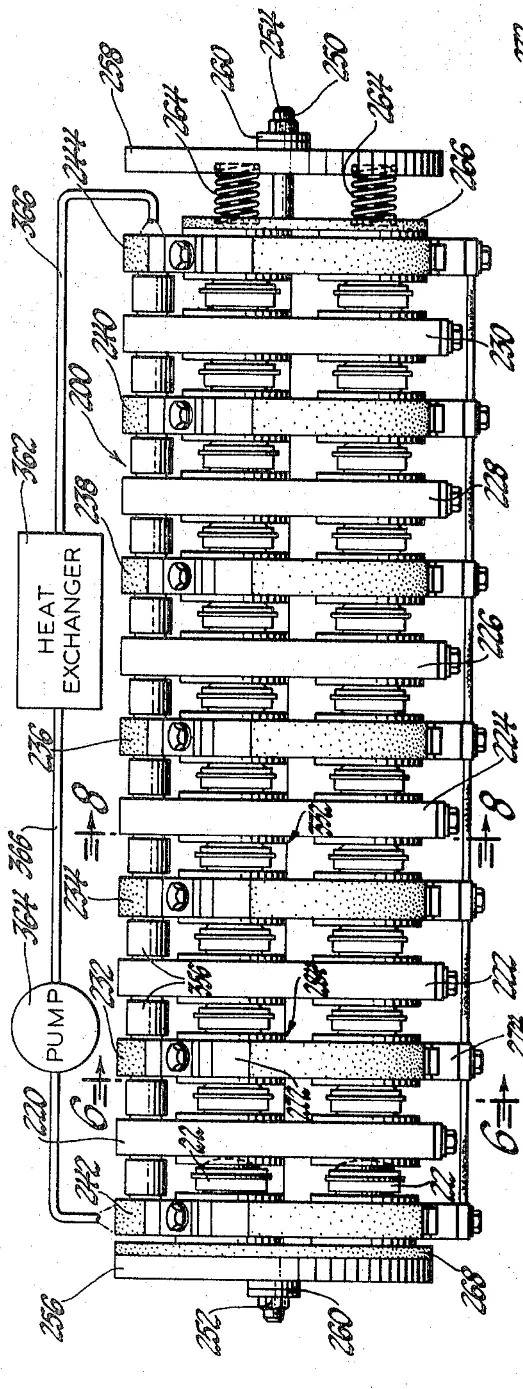
FIG. 5 is a side elevational view of an alternative embodiment of the mounting assembly of this invention.

In the exploded perspective view of FIG. 4, one of the controlled rectifiers 22 is shown which is supported by the mounting assembly of this invention. Each controlled rectifier includes flat end electrodes 24 and 26 on opposite sides of a flat-package or disc-shaped casing. The casing has a semiconductor wafer assembly mounted between the end electrodes and includes a gate electrode connected to a terminal 28 extending through the side of the casing. The casing is typically formed of a ceramic material which insulates the gate electrode terminal from the end electrodes 24 and 26. The end electrodes provide a large area heat sink contact and load current carrying connections with the semiconductor wafer assembly. Pressure is applied to the end electrodes to form a compression bond or pressure contact with the wafer. The pressure contacts provide a sliding action which reduces sheer stresses in the semiconductor wafer assembly caused by temperature variations developed by heat generated within the wafer assembly. It has been found for reliable performance that the pressure at the end electrodes must be applied substantially axially to the electrode ends so that electrode pressure is evenly distributed on the wafer assembly.

The controlled rectifiers 22 are assembled within the mounting assembly 20 in three stacks each respectively including 12 controlled rectifiers in axial alignment. The three stacks are arranged substantially parallel so that each controlled rectifier is laterally arranged and equally spaced from two other controlled rectifiers to form a group or row of three controlled rectifiers in lateral or side-by-side relationship.

The mounting assembly 20 illustrated in FIG. 1 is supported within an hermetically enclosed housing 32 which provide a tank for an evaporative coolant, for example liquid Freon, having a low vaporization or boiling point temperature. The mounting assembly includes a first series of five identical mounting supports designated 34, 36, 38, 40 and 42; a second series of six identical mounting supports designated 46, 48, 50, 52 54 and 56, each respectively including three insulated conductive members; and two end mounting supports 60 and 62 which are included in the first series of mounting supports. The end mounting supports 60 and 62 are substantially the same as the mounting supports designated 34 through 42 except for variations required by placing them at the stack ends.

The mounting support 34 is illustrated in FIG. 3 and is typical of each of the first series of mounting supports 34 through 42. The mounting support 34 includes a circular plate made of a thermally and electrically conductive material such as aluminum. Aluminum is advantageously utilized because it is lightweight and has good heat and electrical conductivity characteristics.

Each side of the mounting support 34 is provided with three pairs of oppositely disposed annular recessed portions designated 64, 66 and 68. Each of the recessed portions of a pair are axially aligned and are equally spaced from the other two pairs of recessed portions and from the center of the plate forming the mounting support. The recessed portions 64, 66 and 68 form locating areas for mounting of the controlled rectifiers 22 as explained more fully in connection with a description of FIG. 4. The center of the mounting support 34 is provided with a circular opening 70. The opening 70 receives an insulation covered tie rod 72 extending axially through the mounting assembly. A threaded stud 74 is secured to the mounting support near the plate edge to provide an electrical terminal for connecting a suitable conductor to the mounting support.

Each of the second series of mounting supports 46 through 56 is identical to the mounting support 46 illustrated in FIG. 2. The mounting support 46 comprises three separate conductive contact plates 76, 78 and 80. The three contact plates 76, 78 and 80 are substantially identical and are formed by a small, substantially rectangular plate of a thermally and electrically conductive material, preferably aluminum. Each contact plate respectively includes a pair of axially aligned recessed annular portions 82, 84 and 86 disposed on opposite sides of the contact plates. The recessed portions 82 through 86 are substantially identical to the recessed portions 64 through 68 provided on the mounting support 34 to also provide locating areas for mounting of the controlled rectifiers 22. A threaded stud, typically shown at 88, is provided on each of the contact plates 76, 78 and 80 at a location near the outer edge. The stud provides an electrical terminal for connecting a suitable conductor to a contact plate.

In FIG. 4, there is illustrated an exploded perspective view of a heat sink assembly which provides an important feature of this invention and includes first and second heat sink members 90 and 92 which supports the individual controlled rectifiers 22. The heat sink members 90 and 92 are cylindrically shaped and are made of a thermally and electrically conductive material, preferably aluminum. Each of the heat sink members includes flat end portions including outer end portions 94 and 96, respectively, and inner end portions 98 and 100, respectively. The diameter of the outer end portions 94 and 96 fits within the edges forming the annular recesses which are provided in the mounting supports, as noted hereinabove. One of the recessed portions 86 of the contact plate 80 and one of the recessed portions 68 of the mounting support 34 are illustrated in FIG. 4 respectively receiving the end portions 94 and 96.

The heat sink outer ends are provided with a plurality of slots or grooves. The slots form a plurality of finned portions 102 which provide expanded cooling surfaces. The slots forming the fins 102 extend axially sufficiently deep so that there is a short distance for transfer of heat from the inner ends of the heat sink members to the finned portions. Heat from the ends of the controlled rectifiers 22 is conducted through the inner ends 98 and 100 of the heat sinks and is substantially concentrated in the finned portions 102. The side cooling surfaces of the fins conduct heat to a cooling fluid surrounding the fins.

The inner end 100 of heat sink 92 includes a spherical seat 103 having a concave recessed surface. The spherical seat 103 receives a spherical member 104 having a convex surface 106 complementary to the surface of seat 103 and an opposite flat end surface 108. The spherical member 104 and seat 103 form a universal joint for adjustable movement of the spherical member 104 which maintains continuous thermal and electrical contact across the joint. The flat end 108 of the spherical member 104 includes a center pin portion 110 and a similar pin portion (not shown) is also provided on the inner end 98 of heat sink 90. The flat surfaces of the spherical member 104 and of the inner end 98 provide a flush contact between the controlled rectifier ends and the heat sink members. The pin portions extend within a corresponding hole opening of the controlled rectifier ends to locate the controlled rectifier and support them when they are being assembled and mounted in stacks.

The three horizontal stacks of controlled rectifiers 22 include the heat sink members 90 and 92 respectively carrying the ends of each of the controlled rectifiers. The outer ends of the heat sinks are respectively supported by one of the first series of mounting supports and by one of the contact plates of the second series of mounting supports. The end mounting support 60 supports three of the heat sinks 90 on its inner side at the left end of the horizontally disposed stacks of controlled rectifiers. At the right end of the mounting assembly the end mounting support 62 supports three of the heat sinks 92.

Insulating plates 114 and 116, formed of a suitable insulation material and being circular with the same diameters as the end mounting supports 60 and 62, are placed on the outer sides of the mounting supports 60 and 62. A pair of aluminum assembly end plates 118 and 120 are provided on the outer sides of the insulating plates 114 and 116. The assembly end plates 118 and 120 are larger than the insulating plates 114 and 116 and extend beyond the outer edges of the insulating plates. The insulating plates 114 and 116 and assembly end plates respectively include center holes for receiving the tie rod 72.

The tie rod 72 extends through the center holes of each of the mounting supports, the end supports 60 and 62, the insulating plates 112 and 116, the assembly end plates 118 and 120. A pair of nuts 130 and 132 are respectively applied to opposite threaded ends of the tie rod 72. The nuts 130 and 132 are mounted to the opposite ends of rod 72 to force, respectively, spherical washers 134 and larger conical washers 136 against assembly end plates 118 and 120. The end plates 118 and 120 press inwardly against the three stacks of controlled rectifiers. This force develops an outward tension force in the tie rod 72. The tie rod 72, nuts 130 and 132, washers 134 and 136, and end plates 118 and 120 provide a means for clamping the assembly 20 together and for applying pressure to the ends of the controlled rectifiers 22.

The force between the assembly end plates is divided axially and along each of the three stacks of controlled rectifiers. The nuts 130 and 132 are tightened so that a tension in the order of 2,400 to 3,600 pounds is developed in the tie rod 72. The tension force of the tie rod 72 is equally distributed across each controlled rectifier so as to provide a compression bond between the end electrodes and the silicon wafer.

The mounting assembly 20 is mounted horizontally within the housing 32 with end plates 118 and 120 sitting on the bottom of the housing. Opposite end portions 140 and 142 of housing 32 are connected to the assembly end by a threaded hole 144 provided in end 140 that receives the left end of the tie rod 72. The right assembly end plate 118 is secured to the end portion 142 by standoff bolts 146 as illustrated in FIG. 1.

A top opening 150 is provided in the housing which is connected by a conduit 152 to one end of a heat exchanger 154 which is a condenser unit. An opposite end of heat exchanger 154 is connected through a conduit 156 to a bottom opening 158 in a lower portion of the housing end portion 140. The interior of the housing 32 is sealed except for the openings 150 and 158. The housing 32 is substantially filled with a liquid Freon coolant so that the liquid covers the top of the mounting assembly 20 to immerse the three stacks of controlled rectifiers. The Freon coolant fills the slot spaces between the heat sink fins, which are all oriented vertically, to absorb heat from the fin surfaces. The Freon evaporates and changes to a gaseous vapor state forming bubbles which rise to the top of the liquid Freon. It has been found that the width of the slots between the fins should be at least one-eighth of an inch so that gas bubbles formed by vaporization are not trapped with the slots.

An evaporative cooling system is therefore provided with the vaporized Freon passing out the top of the housing 32 and into a condenser unit forming the heat exchanger 154. The Freon is cooled and condenses to a liquid which flows down the conduit 156, through the housing opening 158 and into the bottom of the housing 32. The level of liquid Freon in housing 32 is thereby maintained substantially constant.

Suitable bus bar or cable conductors, generally designated 160, are connected as described further hereinbelow to each of the terminal stud connections provided on the first series of mounting supports 34 through 42, the end mounting supports 60 and 62 and also the contact plates comprising the second series of mounting supports 46 through 56.

Figures 8, 9, 10, 11:
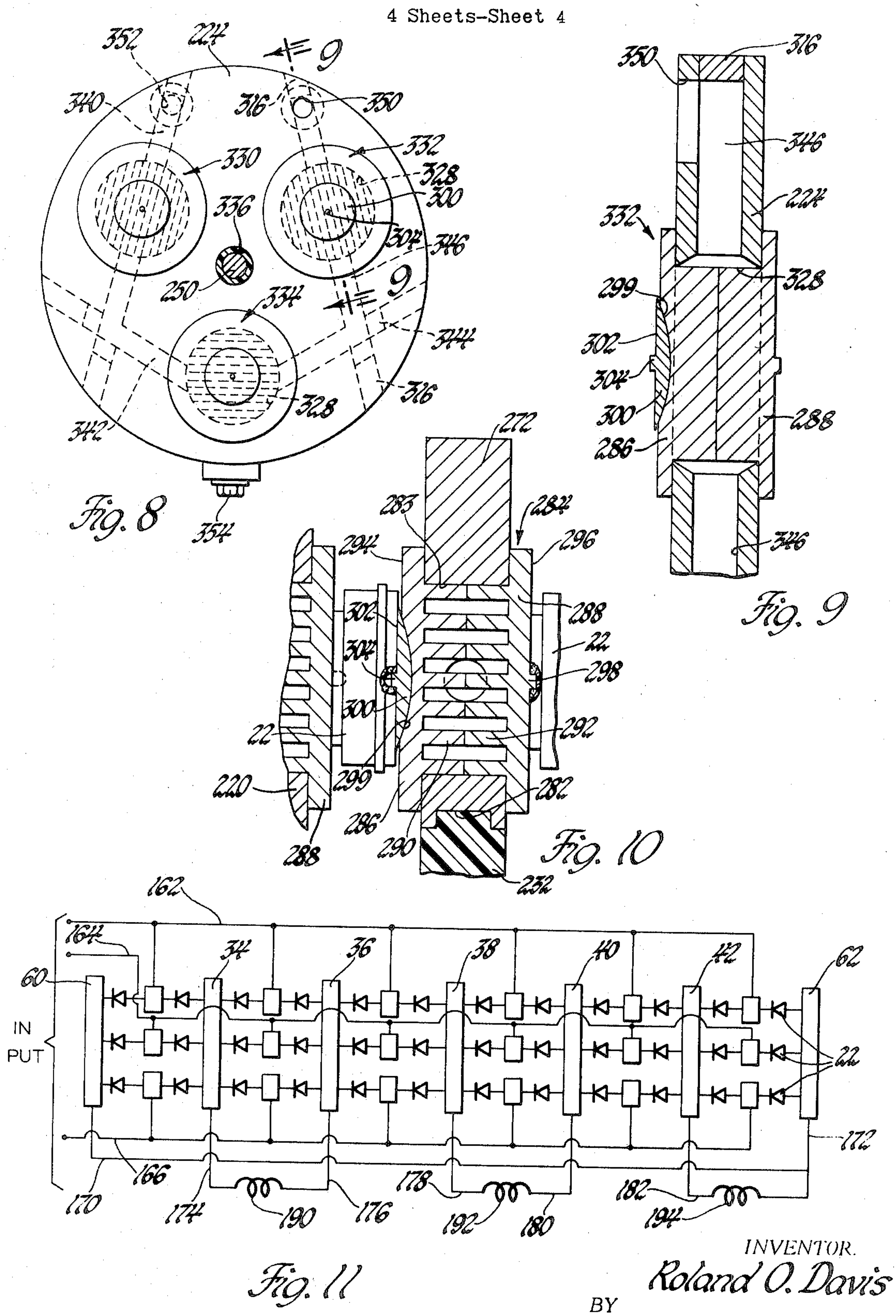
FIG. 8 is a sectional view taken along the line 8–8 of FIG. 5 looking in the direction of the arrows.
FIG. 9 is a sectional view taken along the line 9–9 of FIG. 8 looking in the direction of the arrows.
FIG. 10 is a sectional view taken along the line 10–10 of FIG. 6 looking in the direction of the arrows.
FIG. 11 is a schematic diagram illustrating the embodiment of the invention shown in FIG. 1.

In FIG. 11 a schematic diagram illustrates the electrical connections of the mounting assembly 20 shown in FIG. 1. Electrical conductors 162, 164 and 166 provide three phase input connections to a cycloconverter circuit formed by the 36 controlled rectifiers 22. The conductor 162 is connected to one phase of the input and to the contact plates designated 76 included respectively in each of the second series of mounting supports 46 through 54. The contact plates 76 are all associated with a single stack of controlled rectifiers. In like manner, the conductors 164 and 166 are respectively connected to the contact plates 78 and 80 associated respectively with each of the two other stacks of controlled rectifiers. The conductors 162, 164 and 166 are respectively connected to three terminal studs 168 provided on the housing end portion 142. Connections are made to these terminals from a source of three-phase power such as provided by power utility companies or engine driven alternators, for example. The outline of six output terminals 169 are also indicated on the housing end 142.

The cycloconverter circuit output is provided by seven conductors designated 170, 172, 174, 176, 178, 180 and 182, in FIG. 11. These conductors are respectively connected to the terminals 74 provided on each of the mounting supports 34 through 42 and the end plates 60 and 62. The conductors are connected to a polyphase load comprising, for example, a polyphase drive motor having three phase load windings 190, 192 and 194. The conductors 170 and 172 are connected to the end mounting supports and are further connected together and to one end of winding 194. The conductor 182 is connected to the mounting support 42 and to the opposite end of winding 194. The conductors 174 and 176 of mounting supports 34 and 36, respectively, are connected across load winding 190 and conductors 178 and 180 of mounting supports 38 and 40, respectively, are connected across load winding 192.

The circuit arrangement of the cycloconverter power supply circuit as illustrated in FIG. 11 comprises three groups of fullwave bridge circuits connected between the three phase input conductors 162, 164 and 166 and to each end of the load windings 190, 192 and 194. The controlled rectifiers 22 forming the three stacks are all poled in common polarity as illustrated. Accordingly, each of the mounting supports 34 through 42 and the two end mounting supports 60 and 62, being electrically connected together, form common bridge output terminals between two adjacent groups of three controlled rectifiers. The controlled rectifiers of two groups are poled oppositely to a given mounting support so as to provide a connection in either polarity direction to each phase conductor supplying the input polyphase voltage.

Each of one set of contact plates 76, 78 and 80 of the second series of mounting supports are spaced apart so that they are insulated from each other to provide separate inputs to the bridge circuits from the respective three phase input conductors. One set of contact plates provides six inputs to each of two adjacent groups of three controlled rectifiers associated with one-half of two bridge outputs formed. The latter outputs are formed by two of the first series of mounting supports which are adjacent either side of one set of contact plates. The same circuit arrangement can be provided by rearranging the first and the second series of mounting supports, respectively so that a set of three contact plates replaces each of the solid plates at the end mounting supports. The first and second series of mounting supports are then alternately placed therebetween. The input and output connections respectively are made to the second and first series of mounting supports as noted above except that there are six of the first series of mounting supports respectively connected to one end of each of the load windings.

The gate electrodes of the controlled rectifiers are connected to a source of triggering signals (not shown) to gate controlled rectifiers conductive in a desired sequences. The triggering signals control the voltage, frequencies and wave shapes developed by the controlled rectifiers from the input voltages and applied across the three phase load windings 190, 192 and 194.

A second embodiment incorporating inventive features of the mounting assembly of this invention is shown in FIGS. 5 through 10. The alternative mounting assembly 200 shown in FIG. 5 includes a cooling arrangement including a liquid coolant which is circulated through passages provided within solid plates forming a first and a second series of mounting supports. The assembly 200 is an improvement of the type of mounting assembly disclosed and claimed in copending application A-11,298 filed concurrently with this application. Three stacks comprising 36 controlled rectifiers 22 are arranged as in FIG. 1.

The mounting assembly 200 includes a first series of six substantially identical circular mounting supports designated 220, 222, 224, 226, 228 and 230, a second series of five substantially identical circular mounting supports designated 232, 234, 236, 238 and 240 and two end mounting supports 242 and 244 which are each a modification of the second series of mounting plates 232 through 240. 36 controlled rectifiers 22 are formed into three stacks of semiconductor devices as described in connection with the assembly 20 of FIG. 1 and are mounted between the first and second series of mounting supports. Each of the mounting supports of the first series is formed by a solid plate of thermally and electrically conductive material such as aluminum. Each mounting support of the second series includes plates of insulating material consisting of a phenolic composition, for example, as are the two end mounting supports 242 and 244.

A single tie rod 250 extends through all of the mounting supports and includes nuts 252 and 254 at opposite ends thereof which apply a compressive force to assembly end plates 256 and 258. Two pairs of spherical washers 260 are placed between each of the nuts 252 and 254 and the respective assembly end plates 256 and 258. Three springs 264 are mounted between the assembly end plate 258 and an insulated plate 266 which is placed next to end mounting support 244. Each of the springs 264 are respectively in axial alignment with one of the stacks of controlled rectifiers. The left assembly end plate 256 is made of aluminum and includes an inner surface which is covered by an insulated plate 268. The compressive force of tie rod 250 and nuts 252 and 254 is applied axially along the axis of each of the three stacks of controlled rectifiers 22.

Figure 6:
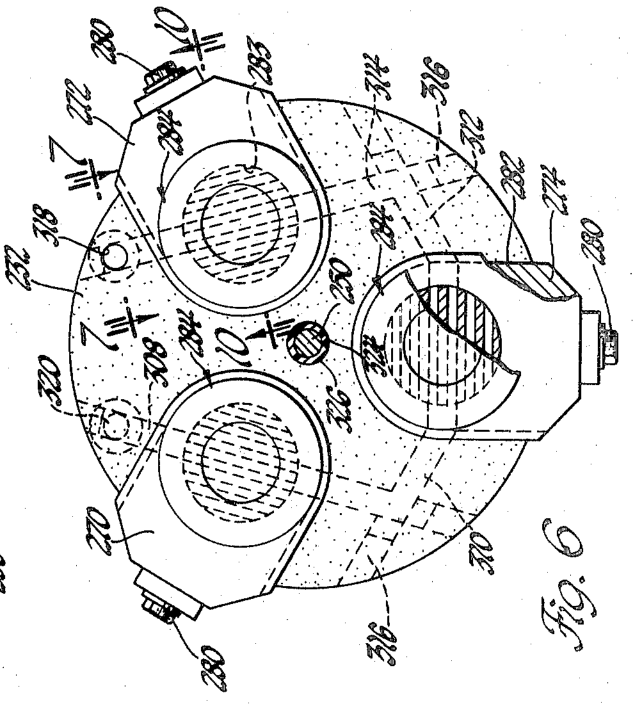
FIG. 6 is a sectional view taken along line 6–6 of fig. 5 looking in the direction of the arrows.

FIG. 6 illustrates the mounting support 232 which is typical of the second series of mounting supports 232, 234, 236, 238 and the two end mounting supports 240 and 242. The mounting support 232 includes a circular plate of insulating material consisting of a phenolic composition. Three contact plates 270, 272 and 274 which are made of a thermally and electrically conductive material such as aluminum form conductive inserts on the insulated mounting support 232. The contact plates include a semicircular inner end portion and parallel sides extending laterally into one of three radially extending U-shaped notches formed in the mounting portions support 232. The contact plates have substantially the same thickness as the support 232 and the sides of the contact plate 272 have a flat groove portion around the edge thereof which is indicated by number 282 in FIG. 10. The grooved sides 282 are cemented to the sides of the notches of support 232 by a suitable adhesive such as an epoxy bonding material. An outer exposed edge of each contact plate includes an electrical terminal 280. The terminal 280 is formed by a threaded stud which is applied to a threaded opening in each of the outer plate ends.

In FIG. 10, the center arrangement of the semicircular ends of the contact plates is shown in section as including a circular hole 283 extending through the sides of the plates. A cylindrical heat sink assembly 284 made of aluminum fits within the hole 283. The heat sink assembly 284 includes first and second heat sink members 286 and 288 which are cemented on either side of the hole 283. Each of the heat sink members includes an inner end having slotted portions forming cooling fins 290 and 292 which extend within the hole opening 283. The outer ends 294 and 296 extend above the side surfaces of the contact plate 272 and overlap the edges of the hole 283. The two members 286 and 288 are secured to the contact plate 272 by a suitable adhesive bonding material such as epoxy. The ends of fins 290 and 292 are in abutting alignment with each other as illustrated in FIG. 10 to form expanded heat exchange surfaces with the slots therebetween communicating with coolant passages described hereinbelow. The side 296 of heat sink part 288 is flat and includes a locater pin 298 formed in the center of the flat surface. The flat side 296 fixedly engages one of the electrode ends of one of the controlled rectifiers 22 with the locator pin 298 located in the center hole of the electrode.

The side 294 of heat sink part 286 is provided with a spherical concave recessed surface which provides a seat to receive a convex side 299 of a spherical member 300. The convex surface 299 of member 300 forms a universal joint at the spherical recessed seat of the heat sink assembly 284. The spherical member 300 includes a flat surface 302 opposite to the convex side 299 and has a locater pin portion 304 for engaging an end of a controlled rectifier. One heat sink assembly 284 is provided in each of the contact plates 270, 272 and 274 so that they are equally spaced apart and from the center of the support 232.

The spherical member 300 and the recessed portion of heat sink member 286 provide a universal joint which allows the member 300 to be movable and self-adjusting relative to heat sink part 286 when pressure is applied to the ends of the stacks of semiconductors. Operative electrode pressure is thus applied axially along the center axis of each controlled rectifier.

The mounting support 232 is provided with cooling passages formed by a plurality of holes 308, 310, 312 and 314 which are drilled through the edge of the mounting support 232. The holes are drilled so as to be aligned with the center of side holes provided in each of the contact plates and extend to edges of the side holes 283 receiving the heat sink members 286 and 288. The passage hole 308 is drilled so as to extend across support 232 and contact plate 270 and into the hole 283 of contact plate 270. The hole 314 extends in a similar manner across support 232 and contact plate 272 and includes the side hole 283 of the contact plate 272. The passage holes 310 and 312 respectively intersect passages 308 and 314 and communicate with passages of contact plate 274 extending into the side hole 283 of the contact plate 274. The ends of the holes of each of the holes 308, 310, 312 and 314 are sealed by a suitable plug 316 applied to the edge of the mounting support as shown in the mounting support 224 in FIG. 9.

An axial passage opening 318 is provided on one side surface of the mounting support 232 extending into the hole 314. On the opposite side a similar axial passage opening 320 is drilled into the hole 308. A continuous passage for a liquid coolant, for example oil, is provided between the opening 318, passage 314, between the fins of the heat sink assembly 284 of the contact plate 270 and to the passage 312. The coolant path continues through the heat sink assembly of the contact plate 274 out the passage 310 and into the passage 308, the heat sink assembly of the contact plate 270 and out the axial hole 320. The center of the mounting support 232 includes a center hole 324 through which the tie bolt 250 extends. The tie bolt 250 is provided with an insulating sleeve as indicated at 326.

The end mounting supports 242 and 244, each including three insulated contact plates, include substantially the same arrangement as the mounting support 232. The inner sides of the end supports 242 and 244 engage the ends of three controlled rectifiers disposed at opposite ends of the three stacks. Also, an external cooling system, described hereinbelow, is connected to the coolant passages of the end mounting supports 242 and 244.

The mounting supports 220, 222, 224, 226, 228 and 230 of the first series of mounting supports are substantially identical and an end view of the mounting support 224 is illustrated in FIG. 8. The mounting support 224 is formed of a circular plate made of aluminum and includes three holes 328 extending axially through the plate which respectively receive heat sink assemblies 330, 332 and 334. These heat sink assemblies are the same as heat sink assembly 284 and include the first and second heat sink members 286 and 288 described with reference to FIG. 10. The heat sink members 330, 332 and 334 are cemented so as to be sealingly secured in the three axial holes of the mounting support 224. The three axial holes 328 are equally spaced apart and from the center of the support 224 which includes a hole opening 336 which receives the tie rod 250. The spacing is the same as that of the heat sink members included in the contact plates 270, 272 and 274 of the mounting support 232.

Coolant passages are formed in the support 224 by drilled holes 340, 342, 344 and 346 and sealed by end plugs 316 to correspond respectively to the passage hole 308, 310 312 and 314 of the mounting support 232. Axial passage openings 350 and 352 are provided on opposite sides of the mounting support 224 to form an inlet and outlet for a coolant path including the three heat sink assemblies 330, 332 and 334.

FIG. 9 illustrates a cross-sectional view of the heat sink members 286 and 288 as they are disposed in each of the first series of mounting supports including the mounting support 224. Accordingly, it is seen in FIG. 10 that the heat sink members 286 and 288 provide supports at the opposite ends of control rectifiers 22 in assembly 200 in the same manner as do the heat sink members 92 and 90 of mounting assembly 20.

An electrical terminal 354 is provided on the edge of the mounting support 224. The terminal 354 includes a bolt or threaded stud applied to a threaded opening in the edge of the support 224. The electrode ends of all of the controlled rectifiers mounted to both sides of the heat sinks 330, 332 and 334 are electrically connected together by the conductive material of the support 224.

Figure 7:
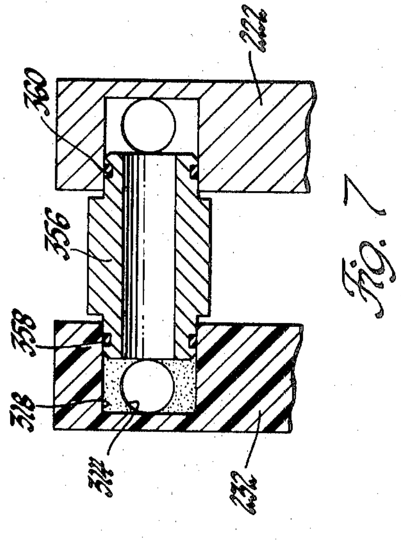
FIG. 7 is a sectional view taken along line 7–7 of FIG. 6 looking in the direction of the arrows.

FIG. 7 illustrates a tubular coupling 356 which interconnects the coolant passages of each of the mounting supports into a continuous liquidtight conduit path for circulating the liquid coolant through the mounting supports of assembly 200. The coupling 356 includes opposite ends having O-ring seals 358 and 360 which form sliding seals with the inner surfaces of each of the axial passage openings of the mounting supports. The coupling 356 maintains a liquidtight passage between the mounting supports with axial movement of the supports caused by pressure being applied to the ends of the assembly. The coupling 356 includes a center portion extending beyond the edges of the axial passage openings to limit the distance that the coupling can extend into the coolant passages.

An external cooling system including a heat exchanger 362 and pump 364 are connected together by a suitable conduit 366 and to the end passages of end mounting supports 242 and 244. The passages of the mounting supports comprising the assembly 200 are filled with an oil coolant which is circulated by pump 364 through the heat sink members supporting the controlled rectifiers and the heat exchanger 362. Heat from the controlled rectifiers is transferred from the heat sink members to the oil which is cooled in heat exchanger 362.

The first series of mounting supports 220 through 230 of assembly 200 provide the same electrical connections to a three-phase load as do the two end mounting supports 60 and 62 and the first series of mounting supports 34 through 42 of assembly 20 illustrated in FIG. 1. Correspondingly, the contact plates 270, 272 and 274 of the second series of mounting supports of assembly 200 provide the same electrical connections to a three-phase input as do the contact plates 76, 78 and 80 comprising each of the second mounting supports of assembly 20.

The set of respectively aligned contact plates of the end mounting supports 242 and 244 and of the mounting supports 232, 234, 236, 238 and 240 associated with one of the rectifier stacks are connected together and to one of the three-phase inputs. The two other sets of aligned contact plates are respectively connected to two other phase inputs. The solid mounting supports 220 and 222 are respectively connected across one phase of a three-phase load. In like manner the mounting supports 224 and 226 and mounting supports 228 and 230 are respectively connected across two other phases of a three-phase load. Accordingly, a cycloconverter power supply circuit is provided by the mounting assembly 200 which provides the same operation as the mounting assembly 20 illustrated in FIG. 11.

The mounting assemblies disclosed hereinabove provide a rugged and compact packaging arrangement for mounting of pressure contact power semiconductors on heat sink members between adjacent mounting supports. The efficient design of the assembly permits the use of aluminum which is less expensive and lighter weight than metals having higher electrical and thermal conductivity characteristics such as copper or silver. The combined spherical seat heat sink mounting arrangements provide a simple and compact means for evenly distributing the pressure applied to the semiconductor ends by tension developed in a single tie rod which compresses the mounting support together.

While the embodiments of the present invention as herein disclosed constitute a preferred form it is understood that other forms might be adopted.

I claim:

1. In a mounting assembly for supporting semiconductors between first and second conductive mounting supports wherein said semiconductors have pressure contact electrodes which are clamped together to apply operative pressures thereacross, the improvement comprising: a plurality of first and second electrically and thermally conductive heat heat sink members each including cooling fins operatively carried by said first and second conductive mounting supports so as to form electrical connections therebetween; a semiconductor having oppositely disposed pressure contact electrodes positioned between each of said first and second heat sink members; means fixedly connecting said first heat sink member to one of said oppositely disposed electrodes; means including a universal joint formed by a spherical member and a spherical recessed seat receiving said spherical member movably connecting said second heat sink member to the other of said oppositely disposed electrodes whereby said semiconductor is adjustable supported by said mounting assembly for maintaining thermal and electrical conductive connections between said semiconductor and said first and second heat sink member when pressure is applied across said oppositely disposed pressure contact electrodes.

2. In a semiconductor mounting assembly including a plurality of conductive mounting supports having annular openings supporting axially aligned pressure contact semiconductors wherein the ends of said mounting supports are clamped together for applying pressure to opposite electrode ends of said semiconductors, the improvement comprising; first and second cylindrically-shaped conductive heat sink members for supporting said semiconductors between adjacent mounting supports; first end portions formed on said heat sink members engaging said electrode ends of one of said semiconductors, one of said first end portions including a concave seat portion and the other of said first end portions including a flat surface; a spherical member, said spherical member having a flat end surface and a spherical end universally movable in said seat portion whereby said spherical member is adjustable relative to said heat sink members to apply pressure evenly to said electrode ends when the ends of said mounting supports are clamped together; and second end portions respectively formed on said heat sink members and mounted within said annular openings of said mounting supports, said second end portions including a plurality of grooves extending through said second end portions and forming cooling fins to provide expanded cooling surfaces in said heat sink members, whereby said heat sink members respectively form electrical connections between said electrode ends and said mounting supports and provide cooling at the electrode ends.

3. A semiconductor mounting assembly for supporting plural stacks of pressure contact semiconductors having oppositely disposed electrode ends, said mounting assembly comprising: a hermetically sealed housing; a plurality of axially arranged mounting supports within said housing formed of a thermally and electrically conductive material, opposite side surfaces formed on said mounting supports respectively supporting axially adjacent electrode ends of semiconductors included in said stacks of pressure contact semiconductors;

means securing said mounting supports together so that force is applied inwardly to both ends of said mounting supports; a plurality of first and second heat sink members formed of an electrically and thermally conductive material respectively engaging the electrode ends of each of said semiconductors and mounting supports disposed adjacent said electrode ends, opposite ends of said heat sink members engaging said mounting supports, said opposite ends including fins separated by groove portions extending tranversely to the axis of said plural stacks of pressure contact semiconductors; inner ends of said heat sink members respectively contacting said electrode ends of one of said semiconductors, one of said inner ends including a spherical recessed portion; a spherical member engaging one of said electrode ends and universally engaging said spherical recessed portion so that said spherical member is movable to provide evenly distributed pressure engagement of said heat sink members with said electrode ends; and an evaporative cooling system for cooling said semiconductors including a liquid coolant having a low boiling point surrounding said mounting supports and filling said groove portions of said heat sink members and further including means having a heat exchanger connected to said housing whereby coolant vapor formed in said housing passes through said heat exchanger and returns to said housing in a liquid state.

4. A mounting assembly for a power supply circuit formed by a plurality of stacks of pressure contact semiconductor controlled rectifiers having oppositely disposed electrode ends, said mounting assembly comprising: a plurality of first conductive mounting supports respectively including opposite side surfaces adapted to support and provide a first predetermined electrical connection between axially adjacent electrode ends of two adjacent groups of said controlled rectifiers included in said stacks; a plurality of said second conductive mounting supports respectively including opposite side surfaces adapted to support and provide a second predetermined electrical connection between axially adjacent electrode ends of two other adjacent groups of said controlled rectifiers included in said stacks, said second mounting supports being axially aligned and alternately spaced relative to each of said first mounting supports; means for applying force to the opposite ends of the axially aligned first and second mounting supports; an enclosed housing including upper and lower openings; means mounting said first mounting supports and said second mounting supports with said housing; a plurality of pairs of first and second heat sink members formed of an electrically and thermally conductive material, said first and second heat sink members respectively engaging said oppositely disposed electrode ends of each of said controlled rectifiers, a plurality of transversely extending grooves forming a plurality of axially extending fin portions in said first and second heat sink members, said first heat sink members including a spherical recessed portion; a spherical member universally engaging said spherical seat so that said spherical member is movable relative to said first heat sink member to provide evenly distributed contact engagement of said first and second heat sink members with said electrode ends, said first and second heat sink members further engaging respectively one of said first and one of said second mounting supports to provide electrical connections between said electrode ends and said first and second mounting supports; an evaporative cooling means for cooling said semiconductors including a coolant surrounding said mounting supports and said heat sink members and further including a heat exchanger means connected with said upper and lower openings of said housing whereby coolant vapor passes through said upper opening of said housing and returns in a liquid form through said lower opening of said housing; and first and second electrical conductor means respectively connected to said first mounting supports and to said second mounting supports and between an electrical source and an electrical load, whereby said first and second mounting supports and said plurality of stacks of pressure contact semiconductor controlled rectifiers provide a power supply circuit for supplying said electrical load from said electrical source.

5. A semiconductor mounting assembly for supporting a plurality of axially aligned pressure contact semiconductors having oppositely disposed electrode ends, said mounting assembly comprising: a plurality of mounting supports formed of a thermally and electrically conductive material and including opposite sides adapted to be disposed between the electrode ends of axially adjacent semiconductors, annular holes being formed in said mounting supports so as to extend coaxially with said axially aligned semiconductors; a plurality of heat sink members respectively disposed in sealing contact with opposite side portions of said mounting supports surrounding said annular holes, an inner portion of said heat sink members having a plurality of grooves extending transversely in each of said annular holes so that a plurality of cooling passages are formed through said heat sink members, and oppositely disposed outer portions extending radially from both sides of said inner portion of said heat sink members, said outer portions being respectively adapted to support one of said electrode ends, at least one of said outer portions including a concave recessed seat portion; a spherical member having a convex portion universally engaging said concave seat portion and a flat portion engaging one of said electrode ends; a pressure applying means clamping the ends of said mounting supports together to apply pressure to said electrode ends of each semiconductor; and a liquid cooling means including means for conducting a liquid coolant through said heat sink cooling passages within said mounting supports so that said coolant conducts heat from said heat sink members to provide cooling of the electrode ends, and said heat sink members further providing, respectively, an electrical connection between adjacent semiconductors disposed on opposite ends thereof and the respectively adjacent mounting supports supporting said heat sink members.

6. A semiconductor mounting assembly for supporting a plurality of axially aligned pressure contact semiconductors having oppositely disposed electrode ends, said mounting assembly comprising: a plurality of conductive mounting supports including annular holes extending axially through said mounting supports in coaxial alignment with said axially aligned semiconductors, internal cooling passages extending within said mounting supports and between said annular holes and a pair of exposed passage openings; a plurality of cylindrical heat sink members including first and second parts extending respectively into either side of said axial holes and on opposite sides of said mounting supports, a plurality of grooves forming fin portions on adjacent ends of said first and second parts, said fin portions extending transversely across said annular holes with said grooves providing a plurality of passages between the internal cooling passages of said mounting supports; a radially extending outer end portion being formed on each of said first and second parts to sealingly overlap opposite sides of said mounting supports surrounding said annular holes, said outer end portions having end surfaces adapted to receive the electrode ends of said semiconductors, one of said outer end portions including a flat surface for engaging an electrode end of a semiconductor disposed on one side of said heat sink member, and the other of said outer end portions including a convex recessed portion; a spherical member having a spherical convex side engaging said recessed portion and a flat side engaging an electrode end of a semiconductor disposed on the other side of said heat sink member; means applying inward force to the opposite ends of the axially aligned semiconductors and heat sink members whereby said spherical member is adjustable to evenly distribute pressure across the electrode ends of said semiconductors when the ends of said heat sink members are forced together; and means connected to said passage openings of said mounting assembly for connecting said heat sink passages in a continuous conduit path including a liquid coolant to thereby cool the respective electrode ends of said semiconductors, said heat members further providing electrical connections between said electrode ends and respectively adjacent mounting supports which support said heat sink members to thereby connect said axially aligned semiconductors in a predetermined circuit arrangement.